PRE-SET TUNER WITH ENGAGEMENT-LOCKING MEANS

Filed Oct. 31, 1966 3 Sheets-Sheet 1

INVENTOR
SIDNEY K. SMART
BY James and Franklin
ATTORNEY

INVENTOR
SIDNEY K. SMART
BY James and Franklin
ATTORNEY

PRE-SET TUNER WITH ENGAGEMENT-LOCKING MEANS

Filed Oct. 31, 1966 3 Sheets-Sheet 3

INVENTOR
SIDNEY K. SMART
BY James and Franklin
ATTORNEY 3,415,128

PRE-SET TUNER WITH ENGAGEMENT-LOCKING MEANS

Sidney K. Smart, Westfield, Mass., assignor to General Instrument Corporation, a corporation of Delaware Filed Oct. 31, 1966, Ser. No. 590,655
22 Claims. (Cl. 74—10.8)

ABSTRACT OF THE DISCLOSURE

Structure for pre-setting individual tuning elements adapted to be sequentially brought to an operative station, said structure being shiftable between operative and inoperative positions respectively engaging and being disengaged from the tuning element in said operative station, the shifting means being so constructed and arranged that when the pre-setting means is in either of its operative positions it remains locked therein until such time as the shifting means is actuated to move it therefrom.

The present invention relates to improvements in a multichannel tuner such as may be employed in a television receiving set in which means are provided for adjustably pre-setting the tuning elements for the individual channels to be received, and relates in particular to an arrangement of parts such as to minimize the torque required in performing the pre-setting operation.

It is common in television receiving set tuning devices to utilize a plurality of individually adjustable tuning elements, one for each channel, the selection of the particular tuning element and its insertion into the tuning circuit providing for channel selection (coarse tuning), the individual adjustment of the thus-selected tuning elements providing for optimum reception of a given channel (fine tuning). In many types of tuners a selected tuning element must be fine tuned for optimum reception each time that it is selected. Having to perform fine tuning operations each time that a channel is changed is troublesome and time consuming. Accordingly it has been proposed that the individual tuning elements be pre-set for what is believed to be optimum tuning conditions, those elements retaining that setting and being readjusted only when necessary. This has represented a substantial advance in ease and simplicity of tuning, a matter of considerable importance in connection with home television reception, where the set is operated in most instances by persons of limited mechanical or scientific ability.

In Stewart and Harten Patent No. 3,236,109 of Feb. 22, 1966, entitled "Pre-Set Tuner," assigned to the assignee of this application, a tuner of the type under discussion is disclosed one of the main operational features of which is that the adjustment of a selected one of a plurality of individually adjustable tuning elements is accomplished through the manual manipulation of a single control element in but a single sense, such as rotation. Initial rotation of the control element first acted through a slip clutch to rotate a cam and cause operative engagement of the adjustment means with the selected tuning element. Further rotation of the control element actuated that adjustment means to cause adjustment of the tuning element while slipping the clutch connection between control element and cam. The cam remained in operative engaging position through torque transmitted through the clutch. This sequence of operative engagement followed by adjustment occurred whether the manual control was actuated in one direction or another to increase or decrease the effective electrical parameter of the selected tuning element.

The only significant disadvantage of said prior art structure is that a comparatively large amount of torque had to be exerted in order to achieve tuning adjustment. The magnitude of the torque required was not so great as to prevent significant commercial acceptance of the prior structure, but it did nevertheless constitute a very definite negative factor insofar as ease of operability is concerned. The reason why this appreciable torque had to be exerted derived from the specific arrangement of parts in the adjusting means. The tuning element to be adjusted resisted such adjustment, and this resistance was transmitted to that portion of the adjustment means engaged with the tuning element, the reaction between the two parts being such as to tend to cause the adjustment means to disengage itself from the tuning element. This tendency had to be resisted. In the structure of the aforementioned Patent 3,236,109 the only element active upon the adjustment means and tending to hold it in operative engagement with the tuning element (thereby opposing the disengagement reaction forces) was the rotational force exerted on the cam of the adjustment means by the drive shaft thereof via the friction clutch which operatively connected them. Thus the frictional effect of that clutch had to be strong enough to continuously urge the cam into its operative engagement with a force sufficient to resist the disengagement force. Since the clutch had to be slipped during the time that actual rotational adjustment of the tuning element was carried out, this clutch frictional force, on the order of 32–40 inch-ounces, had to be manually overcome.

It is the prime object of the present invention to devise an arrangement for a pre-set tuner which will maintain undiminished the various advantages of the pre-set tuner of the type disclosed in Patent 3,236,109 while at the same time greatly diminishing the torque required to produce effective operation of the device.

In accordance with the present invention this objective is achieved by so designing and arranging the cam mounted on the control shaft and the mechanical elements actuated by the cam that once the cam has moved those mechanical elements into a position such that the adjustment means engages with a tuning element, the parts will remain in that relative position and will resist forces tending toward operative disengagement of the parts without having to exert any manual force thereon via the control shaft. As a result the slipping of the friction clutch between cam and control shaft need not produce such forces of resistance, and hence the frictional connection between cam and control shaft can be reduced to something on the order of 8–10 inch-ounces, only about one-quarter of that previously required. The torque required to effect adjustment of the tuning element is correspondingly radically reduced.

More specifically, as in the structure shown in Patent 3,236,109, the adjustment means adapted to be moved into engagement with the tuning element, usually in the form of a gear, is mounted on a plate or other support which is movable between positions corresponding to engagement and disengagement of the gear with the tuning element. The control shaft is provided with a cam connected thereto by a friction clutch, and the plate is provided with a cam follower. In accordance with the present invention the cam is so shaped that when the cam follower engages with a first portion thereof the plate on which the gear is mounted is moved to bring the gear into engagement with a tuning element. As in the prior art device, resistance of the tuning element to rotation produces a reaction force on the gear which tends to return the plate and gear to disengaged position. In accordance with the present invention, the cam is so shaped that when the plate tries to return to its position of disengagement the attendant force exerted on the cam by the cam follower is resisted by the cam itself and without causing the cam to tend to rotate relative to the control shaft to which it is frictionally connected. Thus the cam, when once moved to its adjustment-engaging position, itself serves to retain the elements in engaged position entirely independently of the operative connection between the cam and the control shaft. To put the matter in other words, when the cam is moved to adjustment-engaging position the arrangement of parts is such that the cam locks the parts in engaged position and reliably maintains them in that position against the action of any disengaging reaction forces until such time as the cam is manually moved to its other operative position corresponding to adjustment-disengagement.

One way in which this can be accomplished is by so shaping that portion of the cam surface which is engaged by the cam follower when the adjustment means operatively engages the tuning element that the reaction force exerted thereon is in a direction such as to cause no substantial rotation of the cam, but instead spends itself fruitlessly against the cam itself and associated structure. The cam must still slip with respect to the control shaft in order to enable the latter to produce adjustment of the tuning element, but the frictional connection between the control shaft and the cam needed to maintain the cam in its engagement-producing position no longer has to overcome the disengagement-tending forces of reaction, those forces being overcome by the cam structure itself independently of its connection to the control shaft.

A further object of the present invention is to utilize, in a device of the type under discussion, but a single spring element which performs the dual functions of acting upon the cam so as to urge the latter into its disengagement-producing position and acting upon the adjustment means so as to urge it into its disengaged position, the actions of the spring upon the cam and the adjustment means being direct and independent of one another. This is to be contrasted with the biasing spring employed in the construction of Patent 3,236,109, which acted only upon the adjustment means and affected the cam only indirectly through the intermediation of the adjustment means. In the arrangement of the present invention the individual spring action on the adjustment means and the cam respectively plays a large part in achieving the objectives of the instant invention, and the use of a unitary spring means to accomplish both of these effects results in an appreciable simplification of structure and consequent minimization of cost.

To the accomplishment of the above, and to such other objects as may hereinafter appear, the present invention relates to a tuning assembly providing for pre-setting of a plurality of individually selectable tuning elements, as defined in the appended claims, and as described in this specification, taken together with the accompanying drawings, in which:

Figure 1:
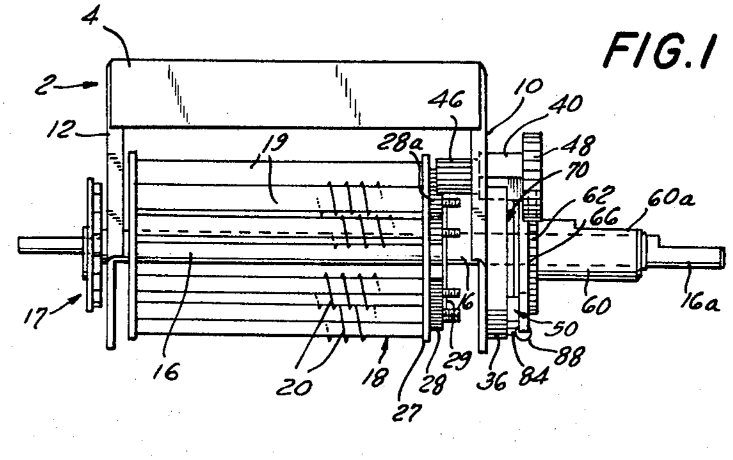
FIG. 1 is a side elevational view of a typical television tuner embodying the present invention.
Figure 2:
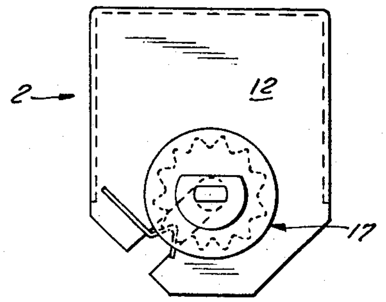
FIG. 2 is an end elevational view thereof taken from the left hand side of FIG. 1.

The tuning assembly comprises a housing generally designated 2 having a top wall 4 on which various electrical elements, such as vacuum tubes or other circuit elements, are adapted to be mounted. The housing 2 is further provided with end walls 10 and 12, and with a removable cover (not shown). A channel selector shaft 16 is journaled in the end wall 10 and extends forwardly therefrom to terminate in an end 16a to which a channel selector knob (not shown) may be secured, and within the housing 2 provides for selection in any appropriate manner, as through a wafer switch or turret construction, for the connection into the tuning circuit of appropriately designed circuit elements such as inductances or capacitances. A detenting structure, generally designated 17 (see FIG. 2) indexes the shaft 16 and its associated switch or turret, into its several operative rotative positions. As here specifically disclosed there is mounted on the shaft 16, within the housing 2, a turret-like body 18 formed of appropriate insulating material which carries, peripherally spaced thereabout, a plurality of tubes 19 having an internal non-circular axial passage, each of which carry an individual tuning coil 20. The inductance of each coil 20 is adapted to be adjusted in known permeability tuning manner by means of a core 23, that core being carried by a screw 24 which is axially movable through the tube 19 but which is non-rotatable relative thereto, as by carrying a piece 25 which cooperates with the non-circular internal cross-section of the tube 19. The screw 24 passes through an internally threaded gear 28 which is mounted at the end of the turret-like body 18 between plates 27 and 29. The ends of each of the coils 20 may be electrically connected to contact buttons carried by the body 18, rotation of the shaft 16 moving the body 18 so that a selected pair of contact buttons corresponding to an individual tuning coil 20 are brought into engagement with contact elements fixedly mounted on the housing 2 and appropriately electrically connected to the overall tuning circuit, thereby bringing into the tuning circuit the individual coil 20 corresponding to the contact buttons which engage those fixed contacts. A showing of a typical structure of this type is to be found in Patent 3,236,109.

It will be apparent that the inductances of the individual coils 20 should correspond to the circuit values required for the optimum reception of signals from different television channels, and it will further be apparent that the inductances of these coils 20 can be adjusted within limits by varying the degree to which they are penetrated by the cores 23, and hence by varying the axial position of their respective tuning screws 24.

Since the fixed contacts are immovable with respect to the support 2 the coil 20 which is in the tuning circuit at any given time will always be in the same location relative to the support 2. That location is hereinafter termed its "adjusting station," and the coil at that station and its adjustment-controlling gear are designated 20a and 28a respectively.

Means are provided for varying the inductance of the particular coil 20a operatively effective in the tuning device while it remains at the adjusting station by axially positioning its adjusting screw 24 via rotation of the gear 28a. As here specifically disclosed a carrier plate or body 36 is mounted on the support end wall 10 for movement parallel to and along that end wall. The end wall 10 is provided with a vertically elongated slot 38 through which a laterally extending portion 40 of the carrier plate or support 36 extends, the end of the portion 40 having a laterally elongated head 41 which is wider than the operative portion of the slot 38. A shaft 42 is journaled in aperture 44 formed in the plate 36 at its extending portion 40, and gears 46 and 48 are made fast on the opposite ends of the shaft 42. As here disclosed the gear 46 is formed integral with the shaft 42, while the gear 48 is rotationally fixed to the shaft 42 in any appropriate manner.

The lower portion of the carrier plate or body 36 is provided with an outwardly extending lip 50 having an upper operative surface defined by right and left hand portions 52 and 54 respectively separated by an intermediate raised vertex portion 56 defining a cam follower. The body 36 is further provided with a vertically elongated slot 58 through which the channel selector shaft 16 freely passes.

A fine tuning or adjustment control shaft 60 is mounted concentrically on the forwardly extending portion of the channel selector shaft 16, and extends forwardly therefrom so that its end **60*a* may have a control knob (not shown) mounted thereon. The shaft 60 has a gear 62 rotationally fixed thereto and located in vertical alignment with the gear 48 on the carrier plate 36, the latter gear 48 being movable vertically relative to the gear 62 as the carrier plate 36 is correspondingly moved, as indicated by the double-headed arrow 64** in FIGS. 5 and 6.

Rotationally mounted on the shaft 60, and frictionally connected thereto by means of a spring clutch assembly generally designated 70, is a cam generally designated 66. This cam 66 comprises a body portion 68 which is received over the shaft 60 and which carries a lower inwardly extending lip thereon generally designated 72, that lip defining angularly separated substantially arcuate cam surface portions 74 and 76, each at substantially the same radial level and to opposite sides of a cam surface portion 78 located at a lower radial level, the cam surface portions 74 and 76 being connected to the cam surface portion 78 by inclined cam surface portions 80 and 82 respectively. The support plate 36 is so located that its vertex portion or cam follower 56 is adapted to engage and slide over the cam surface portions 74, 80, 78, 82, 76 as the cam 66 is rotated relative thereto, the particular cam surface portion engaged by the cam follower 56 being determined by the relative rotative position of the cam 66 relative to the support plate 36.

Figure 3:
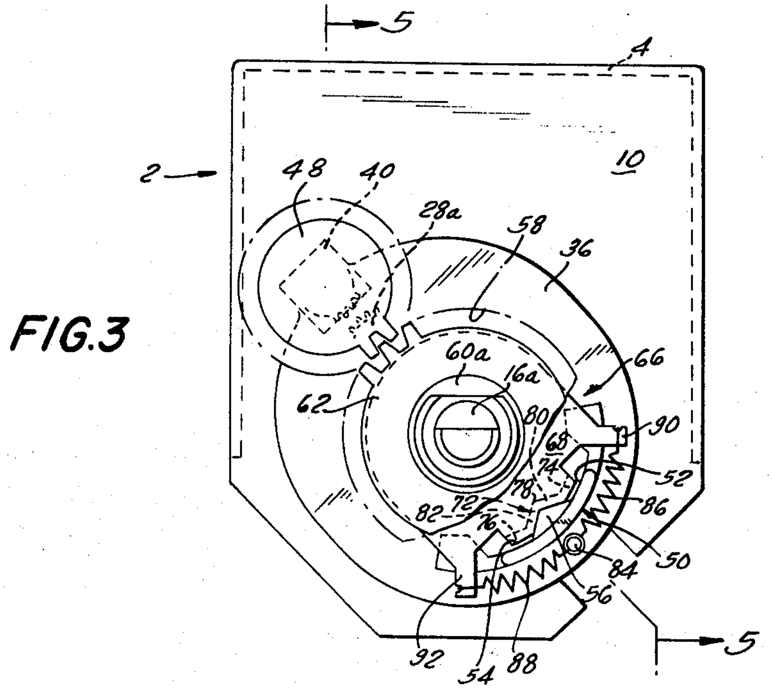
FIG. 3 is an end elevational view, partially broken away, taken from the right hand side of FIG. 1 and showing the position which the parts assume when the control shaft is not rotated, the adjustment means being out of operative engagement with a tuning element.
Figures 5, 6, 8:
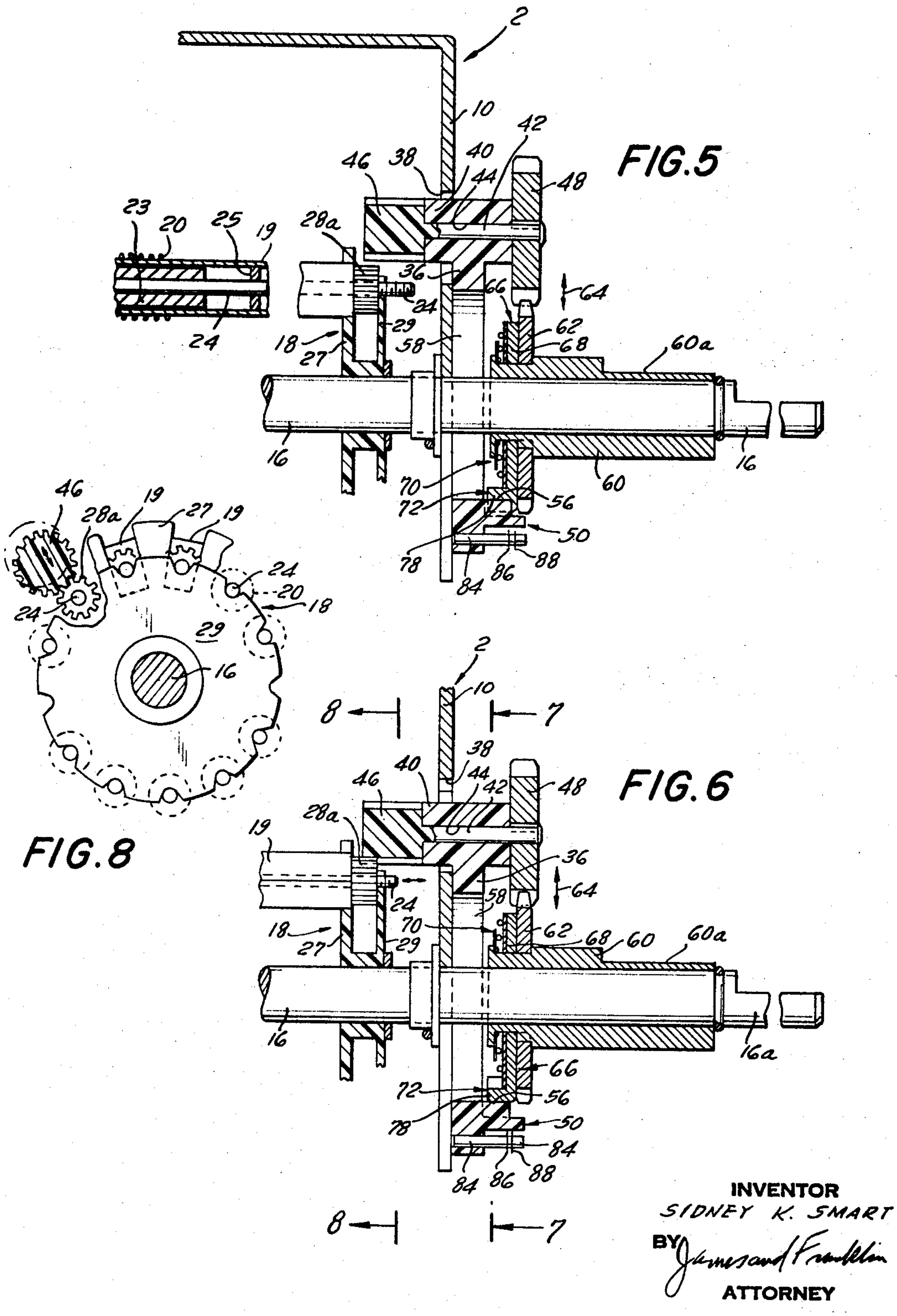
FIG. 5 is a cross sectional view taken along the line 5—5 of FIG. 3.
FIG. 6 is a cross sectional view taken along the line 6—6 of FIG. 4.
FIG. 8 is a cross sectional view on a reduced scale taken along the line 8—8 of FIG. 6.

The lower portion of the support plate 36 carries a pin 84, and individual tension springs 86 and 88 are connected between the pin 84 and arms 90 and 92 respectively extending from opposite sides of the cam 66. Thus the springs 86 and 88 tend to keep the cam 66 rotationally centered relative to the plate 36, thereby so positioning the cam 66 that the cam follower 56 registers with the upper level cam surface portion 78. At the same time, since the springs 86 and 88 exert a component of force vertically as viewed in FIGS. 5 and 6, they tend to pull the support plate 36 upwardly, thus bringing the cam follower 56 into engagement with the lower radial level cam surface portion 78, the cam follower 56 thus, in effect, nesting within that portion of the cam 66 defined by the cam surface portions 80, 78 and 82. This position of the parts is shown in FIGS. 3 and 5, and it will there be apparent that the upward movement of the plate 36 has moved the gear 46 carried thereby upwardly to a position radially spaced and disengaged from the gear **28*a* of the tuning coil 20*a* which is in the adjusting station. With this position of the parts rotation of the channel selector shaft 16 will move the turret-like body 18, thereby to bring a desired tuning coil 20** into the adjusting station.

When it is desired to adjust the tuning element **20*a* in the adjusting station the control shaft 60 for the adjustment means is rotated in one direction or the other. Such rotation of the shaft 60 will first cause rotation of the cam 66, the latter being driven through the friction clutch 70. This clutch must exert sufficient frictional force to overcome the action of the spring 86 or 88 which is extended by the rotation of the cam 66, but that force is minimal in magnitude. As the cam 66 rotates the cam follower 56 rides down along the cam surface portion 80 or 82 (depending upon the direction of rotation of the shaft 60 and cam 66), thereby extending one of the springs 86 and 88 and moving the plate 36 downwardly. This draws the gear 46 downwardly into meshing engagement with the gear 28*a* on the tuning coil 20*a* in the adjusting station. At the same time the gear 48 is moved down into snug operative meshing engagement with the gear 62**.

Figure 7:
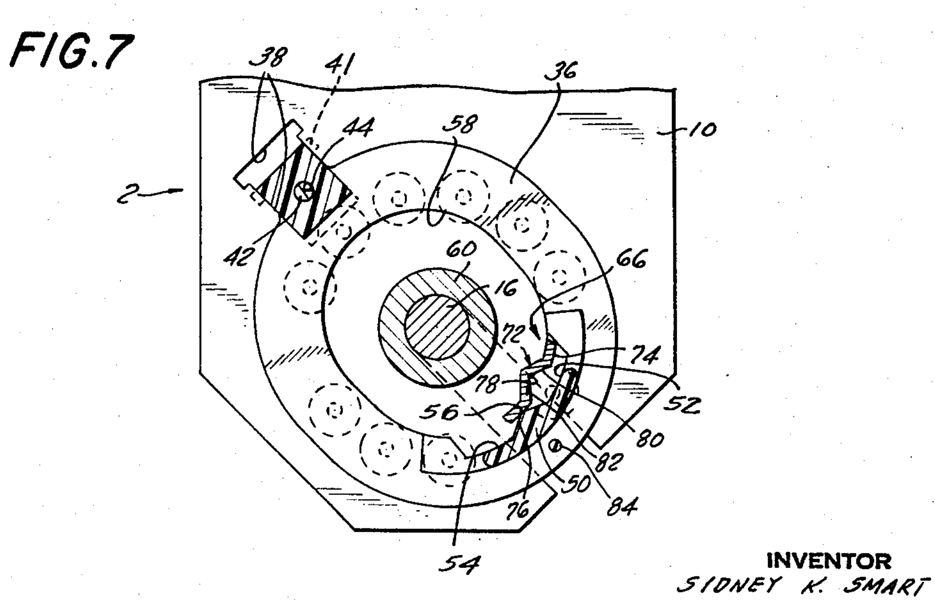
FIG. 7 is a cross sectional view taken along the line 7—7 of FIG. 6.
Figure 4:
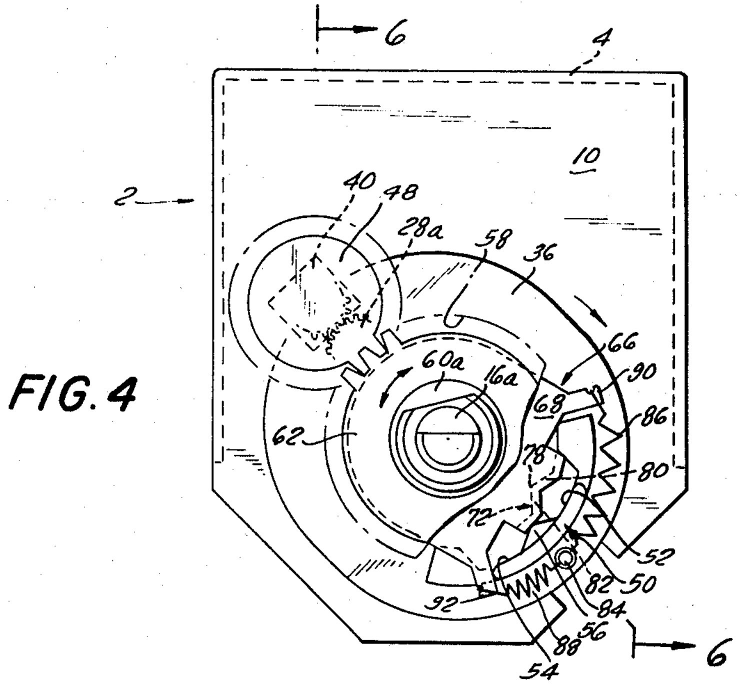
FIG. 4 is a view similar to FIG. 3 but showing the position which the parts assume when the manual control shaft is being rotated, the adjustment means being moved into engagement with a selected tuning element.

As the control shaft 60 is rotated rotation of the cam 66 continues until the cam follower 56 has reached the end of the inclined cam surface 80 or 82. At this point of operation the plate 36 has been moved downward substantially completely and operative adjustment engagement between the shaft 60 and the tuning element gear **28*a* has been effected. Further rotation of the shaft 60 results in further rotation of the cam 66 beyond this position, to the position best shown in FIGS. 4 and 7. In this latter position the cam follower 56 engages the cam surface portion 74 or 76 at a point angularly outwardly spaced from the associated inclined cam surface portion 80 or 82. The thus-engaged points may be considered as the operative cam portions, spaced outwardly from the inclined connecting cam portions 80 and 82 respectively by what may be considered as intermediate cam portions, those intermediate cam portions having an orientation different from that of said inclined connecting cam portions 80 and 82**, and as here specifically shown being substantially non-inclined.

Further rotation of the shaft 60 will not result in any further rotational movement of the cam 66. It will, however, result in further rotation of the gear 62, which in turn drives the gears 48 and 46. Since the gear 46 is in engagement with the gear **28*a*, the latter is rotated and the tuning element 20*a* is adjusted. During this time the shaft 60 is permitted to rotate relative to the cam 66 by slipping the clutch 70. The clutch 70 must be strong enough to maintain the cam 66 in its rotated position against the action of whichever one of the springs 86 or 88** may be tending to return it to its normal intermediate rotative position.

The resistance of the tuning element gear **28*a* to rotation will react upon the gear 46 meshed therewith and will tend to cause the gear 46 to rise. This in turn will tend to cause the gear 46 and carrier plate 36 to rise, and this in turn will urge the cam follower 56 up against that portion 74 or 76 of the operative cam surface with which it is in engagement. However, as may best be seen from FIGS. 4 and 7, the action of the cam follower 56 on the cam 66 will be positively resisted by the engaged portion of the cam, and without exerting any appreciable rotational force on the cam tending to cause it to resume its normal intermediate position. The cam 66 and cam follower 56 may readily be constructed sturdily enough to withstand the forces involved. Since the forces of reaction involved do not tend to cause rotation of the cam 66 relative to the control shaft 60, the force exerted by the friction clutch 70 need not compensate for such forces of reaction. In other words, once the cam 66 has moved to its operative position shown in FIGS. 4 and 7, corresponding to engagement between the adjustment means gear 46 and the tuning element gear 28*a***, the adjustment means is locked in operative adjusting position insofar as reaction forces are concerned, and such reaction forces will be contained and dissipated through the inherent structure of the device and without requiring the manual exertion of any compensating or countervailing forces in the course of tuning adjustment.

Once the desired tuning status of the tuning element **20*a* in the adjusting station has been achieved the operator will release the control knob (not shown) associated with the shaft 60. Driving torque on the shaft 60 will thus disappear. The appropriate spring 86 or 88 which had previously been extended by the tuning operation will rotate the cam 66 and restore it to its centered rotated position, thus bringing the raised level cam surface portion 78 into registration with the cam follower 56, and the springs 86 and 88 will once again pull the carrier plate 36 upwardly until the cam follower 56 engages that upper level cam surface portion 78, thus disengaging the gear 46 from the tuning element gear 28*a* and also lifting the gear 48 relative to the gear 62** to an inoperative position (although not necessarily to a completely disengaged position, as may be seen in FIG. 3).

From the above it will be seen that only a single type of manual manipulation—rotational movement as here specifically disclosed—is required to bring the adjusting parts into operative engagement and effect the desired adjustment. Once the rotary force is released, the adjusting interconnection is automatically broken and the parts automatically assume a position permitting coarse tuning (channel selection) with the individual tuning elements retaining the adjustments to which they have been previously subjected. All of this is as in the construction of Patent 3,236,109. Moreover, the arrangement of parts is such that any tendency of the adjusting parts to disengage while adjustment is being carried out is positively prevented, but without requiring any special force to be exerted by the operator. Hence while the adjusting torques in the construction of the present invention need be in excess of that required to turn the tuning element gear 28*a* by the 8–10 inch-ounces needed to counteract spring 86 or 88 (whichever is extended), this contrasts most favorably with the excess torques of 32–40 inch-ounces required in corresponding prior art construction and represents a decrease in excess driving torque of approximately 400%.

While but a single embodiment of the present invention has been here specifically disclosed, it will be apparent that many variations may be made therein, all within the scope and spirit of the invention.

I claim:

1. In a tuning assembly comprising a body, a plurality of individually adjustable tuning elements, means for bringing said tuning elements sequentially to a given station, and adjusting means on said support for engaging a tuning element at said station and adjusting it, said adjusting means comprising driving means movable between first and second positions respectively engaged with and disengaged from said tuning element at said station, means operatively connected to said driving means for drivingly actuating the latter, and shifting means operatively connected to said driving means for moving the latter between said first and second positions; the improvement which comprises said shifting means comprising a drive shaft operatively connected to said means for drivingly actuating said driving means, cam means operatively connected to said drive shaft and having first and second operative portions corresponding respectively to said first and second positions of said driving means, and a cam follower engaging said first and second operative portions of said cam means in first and second relative positions respectively of said cam-cam follower combination, said cam follower being operatively connected to said driving means for shifting the latter between its first and second positions corresponding to engagement of said cam follower with said first and second cam portions respectively, said first operative cam portion being configured so that pressure exerted thereagainst by said cam follower when said cam-cam follower combination are in said first relative position is ineffective to tend to cause said cam-cam follower combination to assume its second relative position.

2. The tuning assembly of claim 1, in which said cam configuration comprises said first and second operative cam portions being at different levels separated by a connecting portion inclined from said second portion to said first portion, said first portion being spaced from said connecting portion by an intermediate portion of orientation other than inclination from said second portion to said first portion.

3. In the tuning assembly of claim 2, resilient means active on said cam-cam follower combination to urge said combination to its second relative position.

4. In the tuning assembly of claim 2, resilient means active on said cam-cam follower combination to urge said combination to its second relative position, and resilient means active on said driving means to urge it to its second position.

5. In the tuning assembly of claim 2, resilient means active on said cam-cam follower combination to urge said combination to its second relative position, and resilient means active on said driving means to urge it to its second position, both of said resilient means being constituted by a unitary spring means.

6. In the tuning assembly of claim 2, resilient means active on said cam-cam follower combination to urge said combination to its second relative position, and resilient means active on said driving means to urge it to its second position, both of said resilient means being constituted by a unitary spring means, said driving means and said cam follower being operatively connected to a movable support for movement therewith, said unitary spring means being operatively connected between said cam and said support and oriented to have a first component of spring force exerted thereby in a direction from said first to said second position of said driving means and to have a second component of spring force exerted thereby in a direction toward said second relative position of said cam with respect to said cam follower.

7. The tuning assembly of claim 1, in which said cam configuration comprises said first and second operative cam portions being at different levels separated by a connecting portion inclined from said second portion to said first portion, said first portion being spaced from said connecting portion by an intermediate portion which is substantially non-inclined.

8. In the tuning assembly of claim 1, resilient means active on said cam-cam follower combination to urge said combination to its second relative position.

9. In the tuning assembly of claim 1, resilient means active on said cam-cam follower combination to urge said combination to its second relative position, and resilient means active on said driving means to urge it to its second position.

10. In the tuning assembly of claim 1, resilient means active on said cam-cam follower combination to urge said combination to its second relative position, and resilient means active on said driving means to urge it to its second position, both of said resilient means being constituted by a unitary spring means.

11. In the tuning assembly of claim 1, resilient means active on said cam-cam follower combination to urge said combination to its second relative position, and resilient means active on said driving means to urge it to its second position, both of said resilient means and said cam follower being operatively connected to a movable support for movement therewith, said unitary spring means comprising a spring operatively connected between said cam and said support and oriented to have a first component of spring force exerted thereby in a direction from said first to said second position of said driving means and to have a second component of spring force exerted thereby in a direction toward said second relative position of said cam with respect to said cam follower.

12. The tuning assembly of claim 1, in which said cam has a third operative portion on the other side of said second operative portion from said first operative portion, said cam follower engaging said third operative cam portion in a third relative position of said cam follower with respect to said cam and thereby shifting said driving means to its first position.

13. The tuning assembly of claim 12, in which said second cam portion is at a given level and said first and third cam portions are at a different level from said said second cam portion and are separated therefrom by connecting portions each inclined from said second portion to said first and third portions respectively, said first and third portions being spaced from their corresponding connecting portions by intermediate portions of orientation other than inclination from said second portions to said first and third portions respectively.

14. The tuning assembly of claim 12, in which said second cam portion is at a given level and said first and third cam portions are at a different level from said second cam portion and are separated therefrom by connecting portions each inclined from said second portion to said first and third portions respectively, said first and third portions being spaced from their corresponding connecting portions by intermediate portions of orientation other than inclination from said second portions to said first and third portions respectively, and resilient means active on said cam-cam follower combination to urge said combination to its second relative position.

15. The tuning assembly of claim 12, in which said second cam portion is at a given level and said first and third cam portions are at a different level from said second cam portion and are separated therefrom by connecting portions each inclined from said second portion to said first and third portions respectively, said first and third portions being spaced from their corresponding connecting portions by intermediate portions of orientation other than inclination from said second portions to said first and third portions respectively, resilient means active on said cam-cam follower combination to urge said combination to its second relative position, and resilient means active on said driving means to urge it to its second position.

16. The tuning assembly of claim 12, in which said second cam portion is at a given level and said first and third cam portions are at a different level from said second cam portion and are separated therefrom by connecting portions each inclined from said second portion to said first and third portions respectively, said first and third portions being spaced from their corresponding connecting portions by intermediate portions of orientation other than inclination from said second portions to said first and third portions respectively, resilient means active on said cam-cam follower combination to urge said combination to its second relative position, and resilient means active on said driving means to urge it to its second position, both of said resilient means being constituted by a unitary spring means.

17. The tuning assembly of claim 12, in which said second cam portion is at a given level and said first and third cam portions are at a different level from said second cam portion and are separated therefrom by connecting portions each inclined from said second portion to said first and tbird portions respectively, said first and third portions being spaced from their corresponding connecting portions by intermediate portions of orientation other than inclination from said second portions to said first and third portions respectively, resilient means active on said cam-cam follower combination to urge said combination to its second relative position, and resilient means active on said driving means to urge it to its second position, both of said resilient means being constituted by a unitary spring means, said driving means and said cam follower being operatively connected to a movable support, said unitary spring means being operatively connected between said cam and said support and oriented to have a first component of spring force exerted thereby in a direction from said first to said second position of said driving means and a second component of spring force exerted thereby in a direction toward said second relative position of said cam with respect to said cam follower.

18. The tuning assembly of claim 12, in which said second operative cam portion is at a given level and said first and third cam portions are at a different level from said second cam portion and are separated therefrom by connecting portions each inclined from said second portion to said first and third portions respectively, said first and third portions being spaced from their corresponding connecting portions by intermediate portions which are substantially non-inclined.

19. The tuning assembly of claim 12, in which said second operative cam portion is at a given level and said first and third cam portions are at a different level from said second cam portion and are separated therefrom by connecting portions each inclined from said second portion to said first and third portions respectively, said first and third portions being spaced from their corresponding connecting portions by intermediate portions which are substantially non-inclined, and resilient means active on said cam-cam follower combination to urge said combination to its second relative position.

20. The tuning assembly of claim 12, in which said second operative cam portion is at a given level and said first and third cam portions are at a different level from said second cam portion and are separated therefrom by connecting portions each inclined from said second portion to said first and third portions respectively, said first and third portions being spaced from their corresponding connecting portions by intermediate portions which are substantially non-inclined, resilient means active on said cam-cam follower combination to urge said combination to its second relative position, and resilient means active on said driving means to urge it to its second position.

21. The tuning assembly of claim 12, in which said second operative cam portion is at a given level and said first and third cam portions are at a different level from said second cam portion and are separated therefrom by connecting portions each inclined from said second portion to said first and third portions respectively, said first and third portions being spaced from their corresponding connecting portions by intermediate portions which are substantially non-inclined, resilient means active on said cam-cam follower combination to urge said combination to its second relative position, and resilient means active on said driving means to urge it to its second position, both of said resilient means being constituted by a unitary spring means.

22. The tuning assembly of claim 12, in which said second operative cam portion is at a given level and said first and third cam portions are at a different level from said second cam portion and are separated therefrom by connecting portions each inclined from said second portion to said first and third portions respectively, said first and third portions being spaced from their corresponding connecting portions by intermediate portions which are substantially non-inclined, resilient means active on said cam-cam follower combination to urge said combination to its second relative position, and resilient means active on said driving means to urge it to its second position, both of said resilient means being constituted by a unitary spring means, said driving means and said cam follower being operatively connected to a movable support, said unitary spring means being operatively connected between said cam and said support and oriented to have a first component of spring force exerted thereby in a direction from said first to said second position of said driving means and a second component of spring force exerted thereby in a direction toward said second relative position of said cam with respect to said cam follower.

References Cited

UNITED STATES PATENTS

| | | | |
|---|---|---|---|
| 3,148,345 | 9/1964 | Moran | 74—10.8 X |
| 3,244,012 | 4/1966 | Ma et al. | 74—10.8 |
| 3,270,570 | 9/1966 | Stouffer | 74—10.5 |

MILTON KAUFMAN, *Primary Examiner.*

U.S. Cl. X.R.

74—10.54